United States Patent [19]

Huang

[11] Patent Number: 5,974,627
[45] Date of Patent: Nov. 2, 1999

[54] HANDLE FOR STANDARD MECHANICAL INTERFACE (SMIF) POD

[75] Inventor: Chien-Chung Huang, Taichung, Taiwan

[73] Assignee: Taiwan Semiconductor Manufacturing Co. Ltd., Hsin-Chu, Taiwan

[21] Appl. No.: 09/088,954

[22] Filed: Jun. 2, 1998

[51] Int. Cl.[6] .................................................. A47B 95/02
[52] U.S. Cl. ............................. 16/422; 16/406; 16/900; 294/16
[58] Field of Search .................................. 16/114 R, 124, 16/110 R, 111 R; 294/15, 16, 170

[56] References Cited

U.S. PATENT DOCUMENTS

| | | | |
|---|---|---|---|
| 3,861,733 | 1/1975 | Vander Mey | 294/16 |
| 3,903,576 | 9/1975 | Stein | 294/15 |
| 3,923,191 | 12/1975 | Johnson | 294/16 |
| 5,390,972 | 2/1995 | Galloway | 16/114 R |
| 5,409,292 | 4/1995 | Kain et al. | 16/110 R |
| 5,651,581 | 7/1997 | Myers et al. | 16/110 R |
| 5,778,489 | 7/1998 | Marshal II | 16/114 R |
| 5,794,999 | 8/1998 | Corsaro | 294/16 |

*Primary Examiner*—Chuck Y. Mah
*Attorney, Agent, or Firm*—Tung & Associates

[57] ABSTRACT

A handle for a SMIF pod having a handle member with two arms, connected by a crosspiece, and two attachment members, connected respectively to the free ends of the arms, that are attached to two existing handles on the side of a SMIF pod, and wherein the arms are arranged at an angle of about 20° outwardly from the plane of the side of the SMIF pod, and at an angle in the range from 15–45°, preferably about 40°, upwardly from the plane of the attachment means, so that the handle member, which may be of plastic, can be gripped in such a way that a technician's wrists may be kept straight while lifting the pod and reorienting it during handling, and the handle is compatible for use with existing SMIF pods without requiring their modification.

8 Claims, 2 Drawing Sheets

HANDLE FOR STANDARD MECHANICAL INTERFACE (SMIF) POD

FIELD OF THE INVENTION

The present invention relates generally to the manufacture of semiconductor wafers and, more particularly, to a method and means for handling standard mechanical interface (SMIF) pods that contain cassettes for holding substrates such as wafers, masks, etc., using an improved handle arrangement.

PRIOR ART

The design of the currently used handle on 6" and 8" SMIF pods, e.g., the Asyst 9700-4152-01,is primarily suited to automatic handling and causes manual handling by a technician to be uncomfortable when attempting to manipulate the pod. This handle forces technicians' wrists in ulnar deviation, which readily results in disabling wrist disorders among technicians. These disorders may include carpal tunnel syndrome and ulnar nerve entrapment in Guyon's canal. Moreover, current pod handles are not safe to hold as technicians have difficulty in properly gripping them and risk dropping the pods when attempting to manipulate them with these handles. As a result the number of occupational injuries among technicians is significant and the productivity of the technicians is adversely effected.

PROBLEM TO BE SOLVED

It is therefore a problem in the art to provide a suitable handle for SMIF pods that is easy to grip and safe to hold the pod during manipulation so as to reduce the occupational injuries due to manual pod handling by technicians and to increase their productivity.

OBJECTS OF THE INVENTION

It is accordingly an object of the present invention to provide a handle for SMIF pods that is easy and safe to manipulate when moving the pods manually and thus which reduces the occupational injuries to technicians due to pod handling and increases their productivity.

It is another object of the invention to provide a handle design for SMIF pods that makes the handle easier to grip manually for moving the pods and safe to hold and comfortable for the technicians wrists when manipulating the pods during movement.

It is a further object of the invention to provide an improved handle design for SMIF pods that can be used with existing pods without modifying their design.

SUMMARY OF THE INVENTION

The present invention is directed to providing an improved handle for use with SMIF pods that enables a technician to more easily and more comfortably manually grip the handle arms and use them for manipulating the pods during the process of manufacturing semiconductor wafers. The handle design, which includes a handle member, having two arms connected by a crosspiece, and separate attachment members, connected respectively to the free ends of the arms, for attachment to the existing handles of a SMIF pod, is such that it allows a technician when manually gripping the handle arms to maintain his/her wrists straight and to effect different handling postures while manipulating the pod.

Each of the attachment members consists of an elongated bar for engaging the side of an existing pod handle and has an upper flange piece that is fixedly connected to the free ends of the arms of the handle member by suitable fasteners such as bolts. The elongated bars are formed at each end with an extension portion having an upwardly angled arm with an inwardly extending bracket on its end fitted with a screw attachment for connecting the attachment members to the four corners of the existing pod handles. The arms of the handle member are each fixed to the attachment members with angular orientations to facilitate the manual gripping thereof by a technician. The arms are arranged at an angle of about 20° outwardly from the plane of the side of the pod, and at an angle in the range from 15–45°, preferably 40° for ergonomic purposes, upwardly from the plane of the flange piece. The crosspiece of the handle is formed with straight ends and at its center with two downwardly extending arm portions joined by a transverse portion disposed below and parallel to its end portions and fitted with screw attachments for connecting the handle to the top of the pod. The outwardly angled arms of the handle member are preferably of circular cross-section to facilitate their being gripped by the fingers of a technician and the resulting space between the top of the pod and the end portions of the crosspiece leaves room for the technician's thumbs. Thus, the handle member, which may be of plastic, can be gripped in such a way that the technician's wrists may be kept straight while lifting the pod and reorienting it during handling, and the handle combination is compatible for use with existing SMIF pods without requiring their modification.

BRIEF DESCRIPTION OF THE DRAWINGS

These objects, features and advantages will become apparent by the following specification and the appended drawings in which.

DETAILED DESCRIPTION OF THE PREFERRED EMBODIMENT

The present invention embodies an improved handle for use with SMIF pods that makes it easier and more comfortable for a technician to grip manually and use for manipulating the pods during the process of manufacturing semiconductor wafers. The handle design, which may be implemented in plastic, is such that it allows a technician when manually gripping the handle on a SMIF pod to maintain his/her wrists straight and to effect different handling postures while manipulating and reorienting the pod, and it is compatible for use with existing SMIF pods without requiring their modification.

Figure 1:
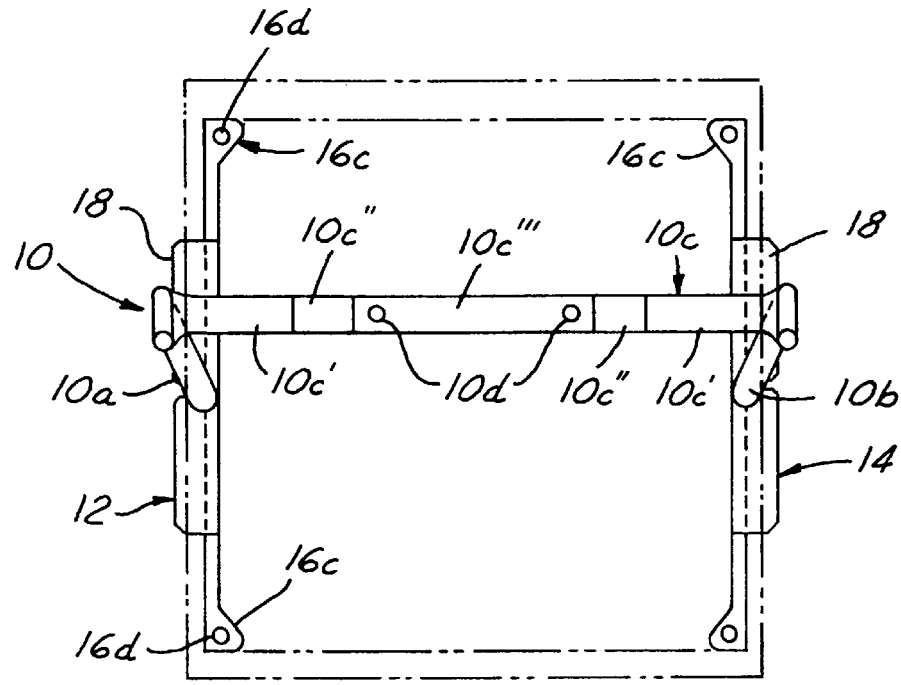
FIG. 1 is a top view of a SMIF pod handle in accordance with the invention.
Figure 2:
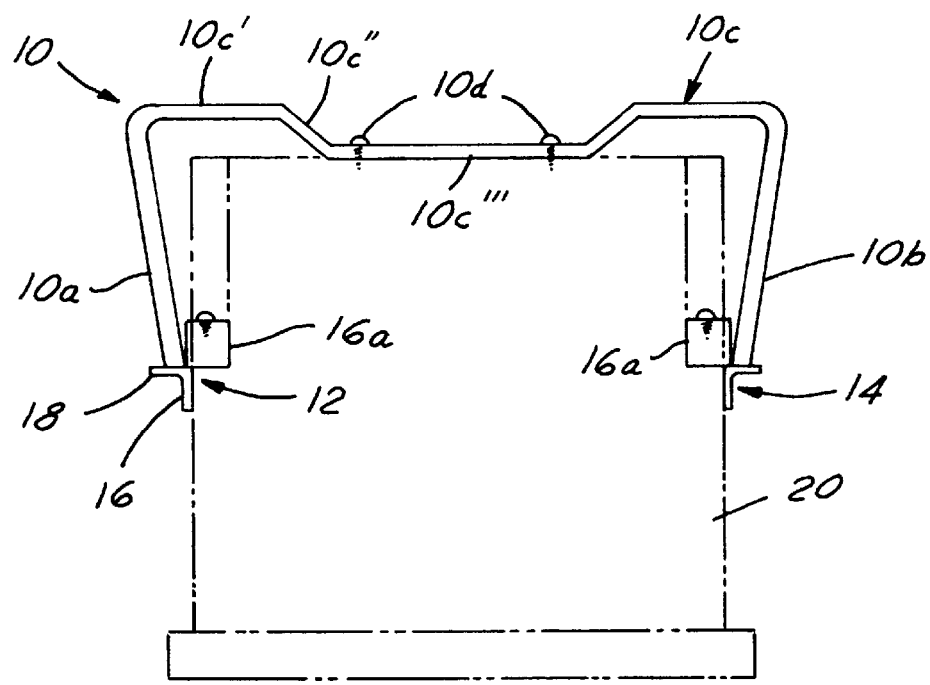
FIG. 2 is a front view of the SMIF pod handle shown in FIG. 1.
Figure 3:
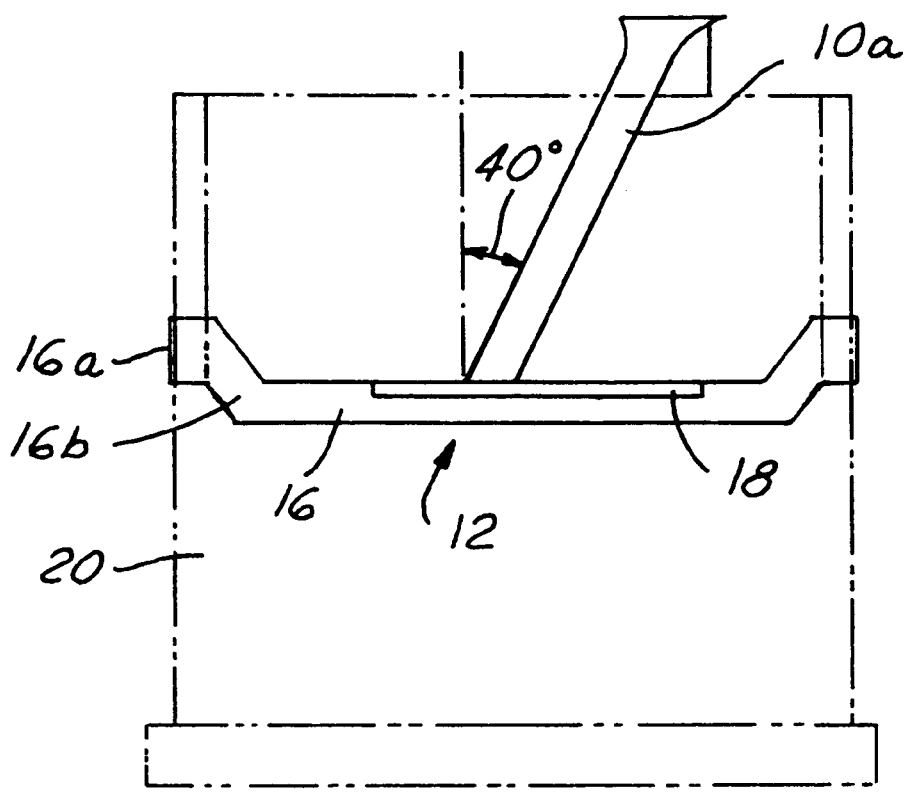
FIG. 3 is a side view of the SMIF pod handle shown in FIG. 1.

A handle design in accordance with the invention is shown in FIGS. 1–3 and generally includes a handle member 10, having two arms 10a and 10b connected by a crosspiece 10c, and separate attachment members 12 and 14, connected respectively to the free ends of the arms 10a and 10b, for attachment to the existing handles of a SMIF pod 20. Each of the attachment members 12 and 14 consists of an elongated bar 16 for engaging the side of an existing pod handle and has an upper flange piece 18 that is fixedly connected to the free ends of the arms of handle member 10 by suitable fasteners such as bolts. The elongated bars 16 are formed at each end with an extension portion 16a having an upwardly angled arm 16b with an inwardly extending bracket 16c on its end fitted with a screw attachment 16d for connecting the attachment members 12 and 14 to the four corners of the existing pod handles.

The arms 10a and 10b of handle member 10 are each fixed to the attachment members 12 and 14 with angular orientations, as best seen in FIGS. 2 and 3, to facilitate the manual gripping thereof by a technician. The arms are arranged at an angle of about 20° outwardly from the plane of the side of the pod, and at an angle in the range from 15–45°, preferably 40° for ergonomic purposes, outwardly from a plane parallel to said crosspiece 10c of the handle member 10. The crosspiece 10c of the handle 10 is formed with straight end portions 10c' and at its center with two downwardly extending arm portions 10c'' joined by a transverse portion 10c''' disposed below and parallel to its end portions 10c' and fitted with screw attachments 10d for connecting the handle member 10 to the top of the pod. The outwardly angled arms, 10a and 10b, of the handle member 10 are preferably of circular cross-section to facilitate their being gripped by the fingers of a technician and the resulting space between the top of the pod and the end portions 10c' of the crosspiece 10c leaves room for the technician's thumbs. Thus, the handle member 10 can be gripped in such a way that the technician's wrists may be kept straight while lifting the pod and reorienting it during handling.

Figure 4:
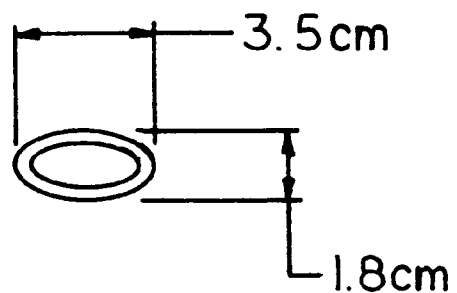
FIG. 4 shows the cross-section of the upper end of the handle arms in accordance with the invention.

An example of a particular embodiment adapted and dimensioned for use with an 8" SMIF pod is as follows. The round arms 10a and 10b of the handle member 10 have a diameter of 2.5 cm and their upper ends joining the crosspiece 10c have a thickness of 1.8 cm and width of 3.5 cm as shown in FIG. 4. The crosspiece 10c has a width of 33.6 cm and a thickness of 0.3 cm. The transverse portion 10c''' at the center of the crosspiece 10c is disposed below the end portions 10c' by 3.5 cm and with the arms at an angle of 40° upwardly from the plane of the flange piece 18 the end portions 10c' are spaced 12.5 cm above the plane of the flange piece 18. The flange piece has a thickness of 0.4 cm and the elongated bar 16 has a height of 2.5 cm and, including the end extensions 16a, is 26 cm long. This arrangement provides a clearance between the upper ends of the arms 10a and 10b and the upper edge of the pod of 2 cm, and between the end portions 10c' of the crosspiece 10c and the top of the pod of 3.5 cm.

It will be seen that with the improved handle design the handle member can be attached directly to the existing pod handle and the pod may be lifted by picking it up on its sides, using the angled arms of the handle member, which arms can be gripped in such a manner as to be comfortable and easy to handle securely without the need for ulnar deviation, so that injury can be avoided and rapid manipulation facilitated for productivity.

The present invention has been described in an illustrative manner, but it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations of the invention, such as fast recovery diodes.

The embodiment of the invention in which an exclusive property or privilege is claimed are defined in the following claims.

What is claimed is:

1. A handle for a SMIF pod comprising:

a handle member having two arms connected by a crosspiece at two fixed ends of said two arms; and two attachment means, connected respectively to two free ends of said two arms, for attachment to two existing handles on the side of a SMIF pod, and wherein:

said arms are arranged at an angle of about 20° outwardly from a plane perpendicular to said crosspiece and at an angle in the range from 15–45°, outwardly from a plane parallel to said crosspiece of the handle member.

2. A handle as in claim 1 wherein said two attachment means each comprise means for engaging the side of an existing pod handle and having an upper flange piece that is fixedly connected to the free end of one of said arms of the handle member.

3. A handle as in claim 2 comprising bolt means for fixedly connecting said free end of said arms of the handle member to said upper flange piece.

4. A handle as in claim 2 wherein said two attachment means each further comprise an elongated bar, supporting said upper flange piece, and formed at each end with an extension portion having an upwardly angled arm with an inwardly extending bracket on its end fitted with a screw attachment for connecting the attachment means to the end corners of an existing pod handle.

5. A handle as in claim 1 wherein said crosspiece is formed with two straight end portions joined by two downwardly extending arm portions to a transverse portion disposed below and parallel to said end portions, said transverse portion being fitted with screw attachments for connecting said transverse portion to the top of the pod.

6. A handle as in claim 5 wherein said end portions of said crosspiece are dimensioned to be spaced from the top of the pod to leave room for the technician's thumbs.

7. A handle as in claim 1 wherein said arms of the handle member are of circular cross-section for facilitating their being gripped by the fingers of a technician.

8. A handle as in claim 1 wherein said arms are arranged at an angle preferably about 40° outwardly from a plane parallel to said crosspiece of the handle member.

* * * * *